(12) United States Patent
Oesterle et al.

(10) Patent No.: US 9,716,217 B2
(45) Date of Patent: Jul. 25, 2017

(54) EXHAUST SYSTEM WITH THERMOELECTRIC GENERATOR

(75) Inventors: Jörg Oesterle, Laichingen (DE); Rolf Jebasinski, Filderstadt (DE); Thomas Nording, Esslingen (DE); Georg Wirth, Kirchheim/Teck (DE)

(73) Assignee: EBERSPAECHER EXHAUST TECHNOLOGY GMBH & CO. KG, Neunkirchen (DE)

( * ) Notice: Subject to any disclaimer, the term of this patent is extended or adjusted under 35 U.S.C. 154(b) by 1579 days.

(21) Appl. No.: 12/945,649

(22) Filed: Nov. 12, 2010

(65) Prior Publication Data

US 2011/0146743 A1 Jun. 23, 2011

(30) Foreign Application Priority Data

Dec. 17, 2009 (DE) ........................ 10 2009 058 948

(51) Int. Cl.
*H01L 35/32* (2006.01)
*F01N 5/02* (2006.01)

(52) U.S. Cl.
CPC .............. *H01L 35/32* (2013.01); *F01N 5/025* (2013.01); *Y02T 10/16* (2013.01); *Y10T 29/49108* (2015.01); *Y10T 29/49398* (2015.01)

(58) Field of Classification Search
USPC ....................................................... 136/224
See application file for complete search history.

(56) References Cited

U.S. PATENT DOCUMENTS

| | | | | |
|---|---|---|---|---|
| 3,524,772 A | * | 8/1970 | Purdy | ............................ 136/205 |
| 5,968,456 A | * | 10/1999 | Parise | ............................ 422/174 |
| 6,073,449 A | | 6/2000 | Watanabe et al. | |
| 6,096,966 A | | 8/2000 | Nishimoto et al. | |
| 2003/0140957 A1 | * | 7/2003 | Akiba | ............................ 136/224 |

FOREIGN PATENT DOCUMENTS

| | | | |
|---|---|---|---|
| DE | 10 2006 039 024 A1 | 2/2008 | |
| EP | 1 780 807 A1 | 5/2007 | |
| JP | 61254082 A | * 11/1986 | .................... 136/200 |
| JP | 3-066182 A | 3/1991 | |
| JP | 7-106641 A | 4/1995 | |
| JP | 9-051126 A | 2/1997 | |
| JP | 10-012934 | 1/1998 | |
| JP | 2002-111076 | 4/2002 | |
| JP | 2003-282966 | 10/2003 | |
| JP | 2007-006619 | 1/2007 | |
| JP | 2007-239595 | 9/2007 | |
| WO | 2008/106099 | 9/2008 | |

* cited by examiner

*Primary Examiner* — Jennifer Michener
*Assistant Examiner* — Christopher Danicic
(74) *Attorney, Agent, or Firm* — Greer, Burns & Crain, Ltd.

(57) ABSTRACT

The present invention relates to an exhaust system for a combustion engine, more preferably of a road vehicle, with at least one exhaust gas-conducting component having a ring-shaped closed inner wall in circumferential direction, whose inner side is exposed to the exhaust gas.

Figure 1:
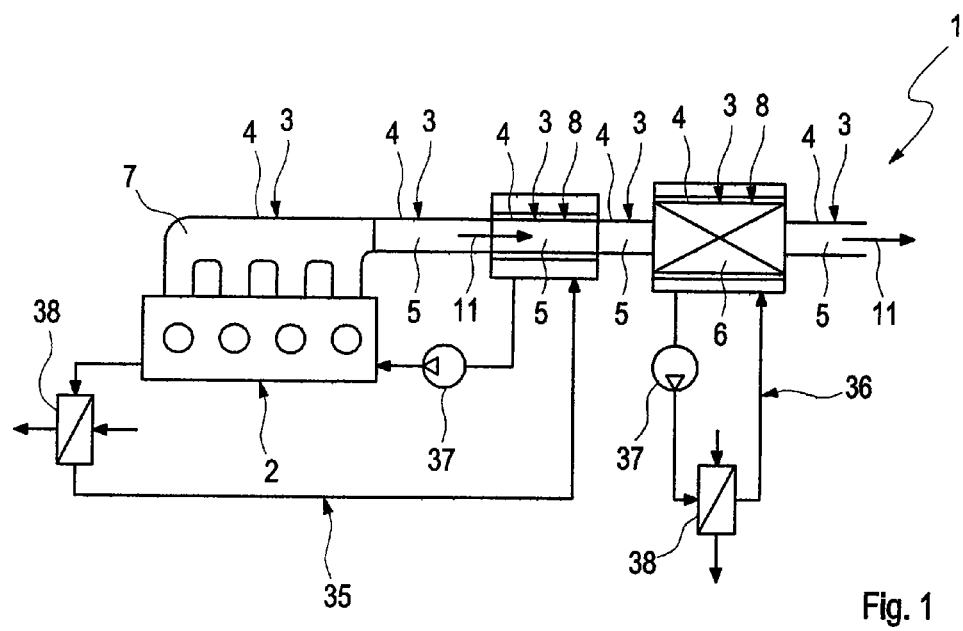

The energetic efficiency of the combustion engine can be improved with at least one thermoelectric generator which converts heat into electric energy and which is arranged on an outer side of the inner wall.

18 Claims, 4 Drawing Sheets

EXHAUST SYSTEM WITH THERMOELECTRIC GENERATOR

The present invention relates to an exhaust system for a combustion engine, more preferably of a road vehicle or another mobile or stationary device. In addition, the invention relates to a thermoelectric generator for such an exhaust system. Furthermore, the invention relates to a method for producing such an exhaust system.

Exhaust systems are generally known and with combustion engines serve for the discharging of combustion exhaust gases. Such an exhaust system comprises a multiplicity of different components, such as for example pipes and exhaust gas treatment devices. The individual components are connected to one another and form an exhaust line in which the individual exhaust gas treatment devices are connected to each other via pipes. Exhaust gas treatment devices are for example oxidation catalytic converters, particle filters, SCR-catalytic converters and NOX storage catalytic converters.

The present invention deals with the problem of stating an improved embodiment for an exhaust system more preferably characterized in that it makes possible improved energy recovery, as a result of which more preferably the energetic efficiency of the combustion engine equipped with the exhaust system or a vehicle equipped with the combustion engine and the exhaust system is to be increased.

According to the invention, this problem is solved through the subjects of the independent claims. Advantageous embodiments are the subject of the dependent claims.

The invention is based on the general idea of converting the heat contained in the exhaust gas into electric energy. To this end, the invention proposes to couple at least one component of the exhaust system having an inner wall conducting exhaust gas with the combustion engine in operation to a thermoelectric generator converting heat into electric energy. By means of this, the waste heat contained in the exhaust gas can be directly utilised for generating electric energy which can be made available to the combustion engine or the vehicle equipped with such a combustion engine. To that extent, the energetic efficiency of the vehicle can be improved.

Thermoelectric generators for example operate according to the principle of a Peltier element, however in an inverse operating mode. While a Peltier element through the application of a voltage transports heat from a cold side to a warm side of the Peltier element, this principle is reversed with a thermoelectric generator or an individual thermoelectric element such that electric voltage created through the flow of heat from a warm side to a cold side of the thermoelectric element, is tapped off. With the help of such a thermoelectric element, heat flow can thus be converted into electric energy.

Specifically, the invention proposes to arrange the thermoelectric generator on an outer side of the inner wall of the component whose inner side is exposed to the exhaust gas. Thus the inner wall separates the thermoelectric generator from the exhaust gas and more preferably protects it from being contaminated by the exhaust gas. Here, the inner wall is closed in circumferential direction and can be a pipe or form a pipe-shaped section of the respective component. Here, the circumferential direction is based on the flow direction of the exhaust gas in the component or on the main flow direction of the exhaust gas in the component in such a manner that said flow direction or main flow direction defines an axial direction with respect to which the circumferential direction circulates.

According to an advantageous embodiment the thermoelectric generator can surround the inner wall ring-like in circumferential direction in a closed manner. Thus the thermoelectric generator encloses the inner wall, which makes possible even heat emission from the inner wall to the thermoelectric generator. At the same time, the effectiveness of the heat utilisation can be improved.

According to another advantageous embodiment the component can comprise an outer wall, which surrounds the inner wall of the component ring-like in circumferential direction in a closed manner. The thermoelectric generator is then arranged between the inner wall and the outer wall. Because of this, the thermoelectric generator is encapsulated between the two walls, as a result of which it is protected on the one hand from the exhaust gas through the inner wall and on the other hand from the surroundings of the exhaust system through the outer wall, which improves the operational safety of the thermoelectric generator.

With another advantageous embodiment a cooling jacket can be provided, which surrounds the inner wall ring-like in circumferential direction in a closed manner, wherein the thermoelectric generator is then arranged between the inner wall and the cooling jacket. The cooling jacket makes possible a specific lowering of temperature on the outside of the thermoelectric generator. On the one hand, the temperature drop from the inside of the thermoelectric generator to the outside of the thermoelectric generator is increased. On the other hand, the heat transported via the thermoelectric generator from the inside to the outside can be quickly discharged via the cooling jacket in order to maintain the high temperature differential. Because of this, the conversion of the heat into electric energy can be improved.

The cooling jacket in the simplest case can be formed by a double-walled pipe with ring-shaped channel cross section. Likewise, the cooling jacket can be formed by a cooling tube which extends helically about the thermoelectric generator and is aligned coaxially to the inner wall.

Practically, the outer wall of the component mentioned before can be formed by an inner wall of the cooling jacket, as a result of which the degree of integration of the exhaust system in the region of the thermoelectric generator is improved, which results in less weight and reduced manufacturing costs. Alternatively, the outer wall of the component can contact an inner wall of the cooling jacket. As a result of this, separate manufacture is made possible which can lead to simplified assembly.

According to an advantageous embodiment the thermoelectric generator can directly contact the outer side of the inner wall, wherein however it can be more preferably provided that the thermoelectric generator has an inner contact layer with which it directly contacts the outer side of the inner wall. The direct contact between thermoelectric generator and inner wall improves the heat transfer between inner wall and thermoelectric generator, which improves the effectiveness of power generation.

According to another advantageous embodiment the thermoelectric generator can be supported on an inside of the outer wall of the component or on an inner side of an inner wall of the cooling jacket via a spring structure under preload. With the help of this spring structure a preload is thus generated, which on the one hand presses the thermoelectric generator against the inner wall of the component and on the other hand also brings about preloaded supporting of the thermoelectric generator with respect to the outer wall of the component or the inner wall of the cooling jacket. In addition to this, the spring structure makes possible relative movements of the thermoelectric generator with respect to the outer wall of the component or with respect to the inner wall of the cooling jacket.

This is an advantage especially when in the case of a cold start of the combustion engine the exhaust system initially heats up. In the process, the inner wall exposed to the exhaust gas heats up first, as a result of which it expands toward the outside. Because of this, the thermoelectric generator is also moved toward the outside and pressed against the colder outer wall of the component or against the colder inner wall of the cooling jacket. In the process, the preload generated with the help of the spring structure is increased at the same time. The spring structure thus makes possible compensation of thermally-related expansion effects. At the same time, it increases the preload with which the thermoelectric generator contacts the heat source (inner wall) or the heat sink (outer wall of the component or inner wall of the cooling jacket). It has been shown that the quality of the heat transfer increases the higher the preload between heat source and thermoelectric generator on the one hand and heat sink and thermoelectric generator on the other hand. The preload generated with the help of the spring structure thus results in increased efficiency of the energy conversion.

Particularly advantageous is an embodiment, wherein the thermoelectric generator is constructed in a modular manner, so that it comprises a plurality of generator modules. These generator modules can be simply interconnected in order to be able to easily adapt the respective thermoelectric generator to different installation situations. The power of the thermoelectric generator can also be determined through the number of generator modules used. The individual generator modules can be arranged adjacently in circumferential direction, so that they form circumferential segments of the thermoelectric generator each. It is likewise possible to customize the generator modules in such a manner that they are arranged adjacently in axial direction. Consequently, the generator modules then form axial sections of the thermoelectric generator. Here, the axial direction corresponds to the flow direction or main flow direction of the exhaust gas within the inner wall of the component. It is likewise possible to arrange generator modules adjacently to one another both in the circumferential direction as well as in the axial direction in order to construct the thermoelectric generator. The modular design for the thermoelectric generator also simplifies the attachment of the thermoelectric generator to the outside of the inner wall, which facilitates the manufacture of the exhaust system.

According to the invention, such an exhaust system can be produced in that the outer wall, if the thermoelectric generator is arranged between the inner wall and the outer wall, is plastically deformed with the objective of a defined cross section reduction. In other words, the component equipped with the thermoelectric generator is specifically deformed plastically as with a canning process of a catalytic converter or a particle filter. The deformation of the outer wall is effected such that for the thermoelectric generator a desired radial preload is generated which is advantageous for the heat transfer between inner wall and generator on the one hand and between generator and outer wall on the other hand. Because of this, the manufacture of the component equipped with the generator is simplified since assembly can be realised before the cross section reduction of the outer wall in an unloaded state, so that it is for example easily possible to attach the thermoelectric generator on the outside to the outer wall or insert it in the outer wall.

Further important features and advantages of the invention are obtained from the subclaims, from the drawings and from the corresponding figure description by means of the drawings.

It is to be understood, that the features mentioned above and still to be explained in the following cannot only be used in the respective combination stated, but also in other combinations or by themselves, without leaving the scope of the present invention.

Preferred exemplary embodiments of the invention are shown in the drawings and are explained in more detail in the following description, wherein same reference characters refer to same or similar or functionally same components.

It shows in each case schematically

Figure 2:
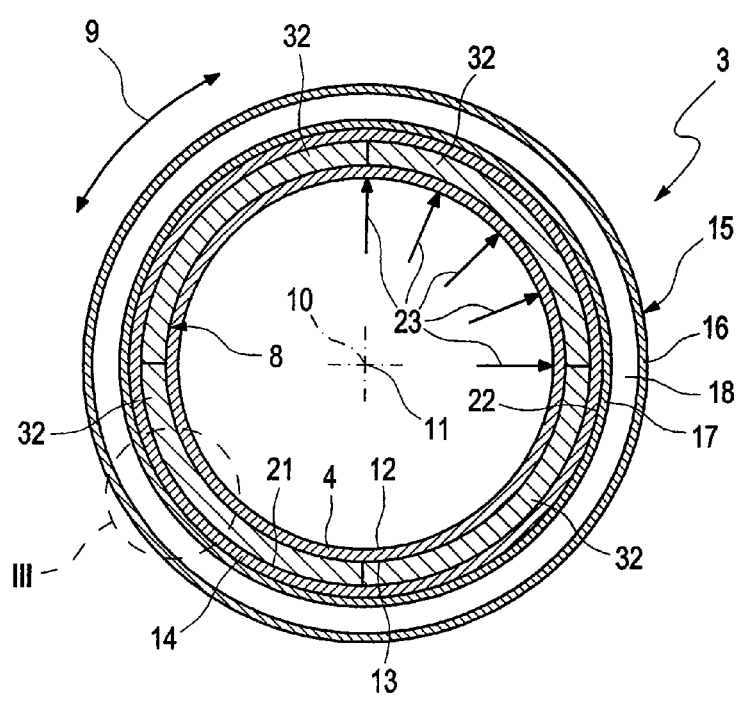
Figure 3:
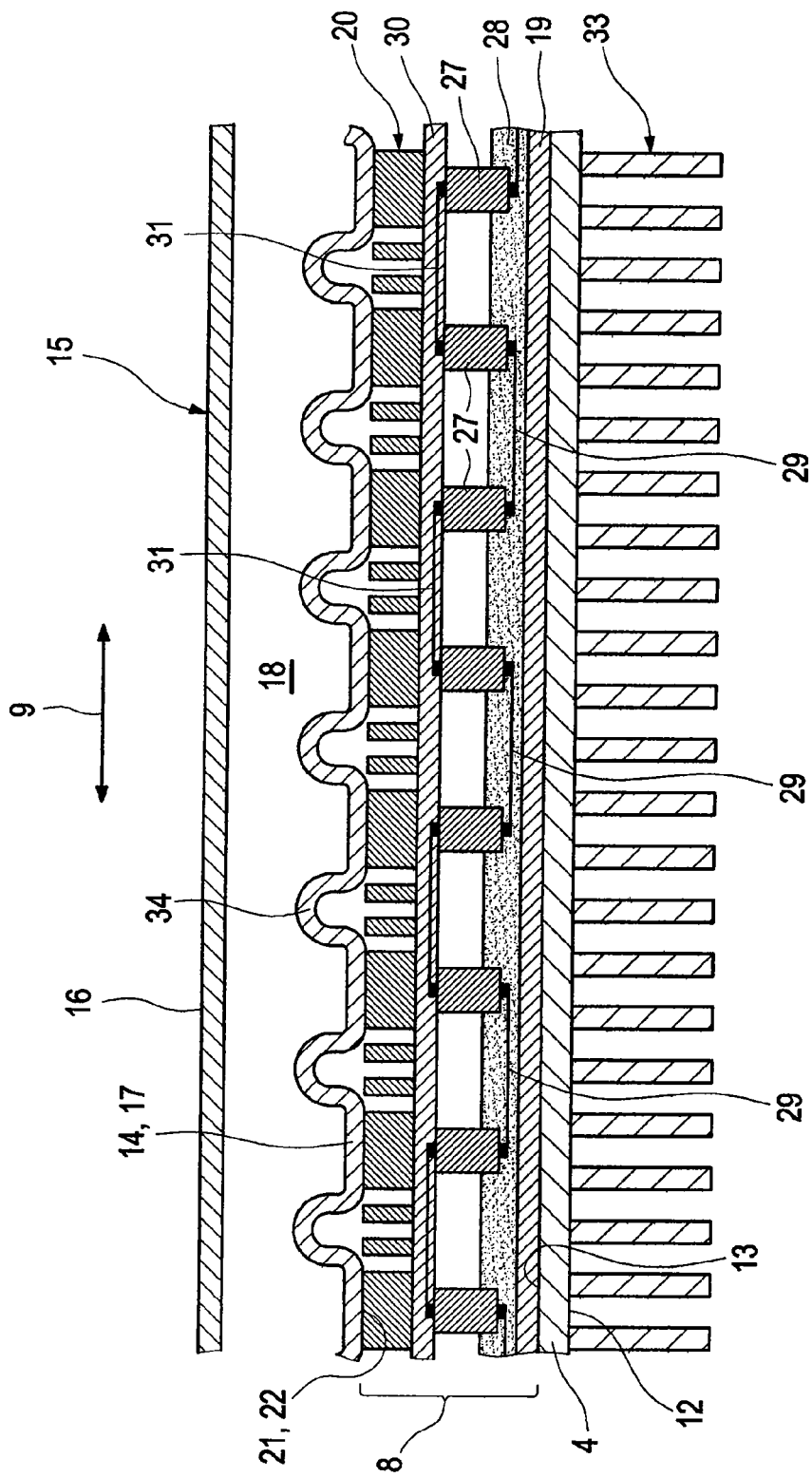
Figure 4:
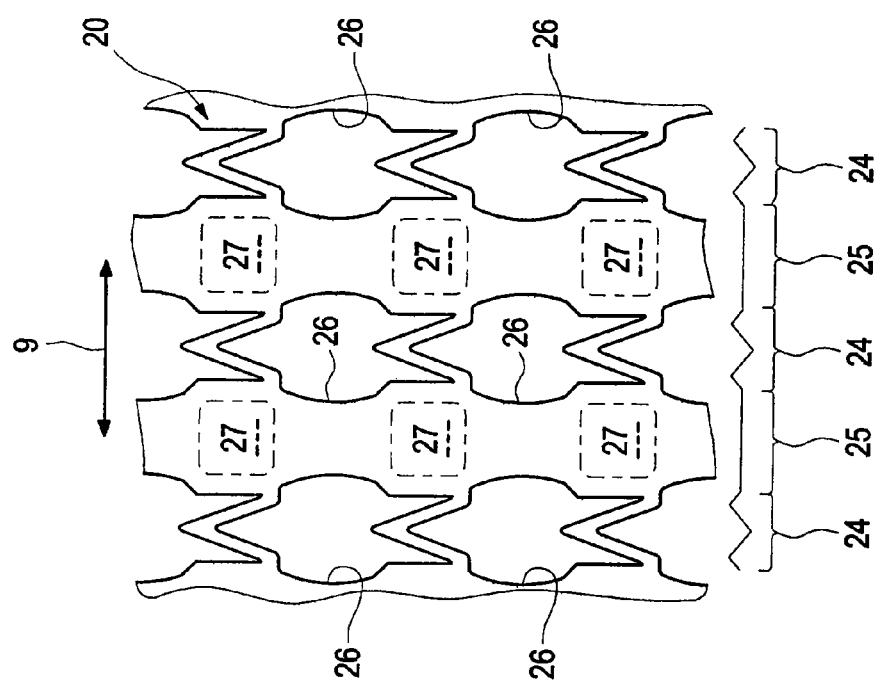
Figure 5:
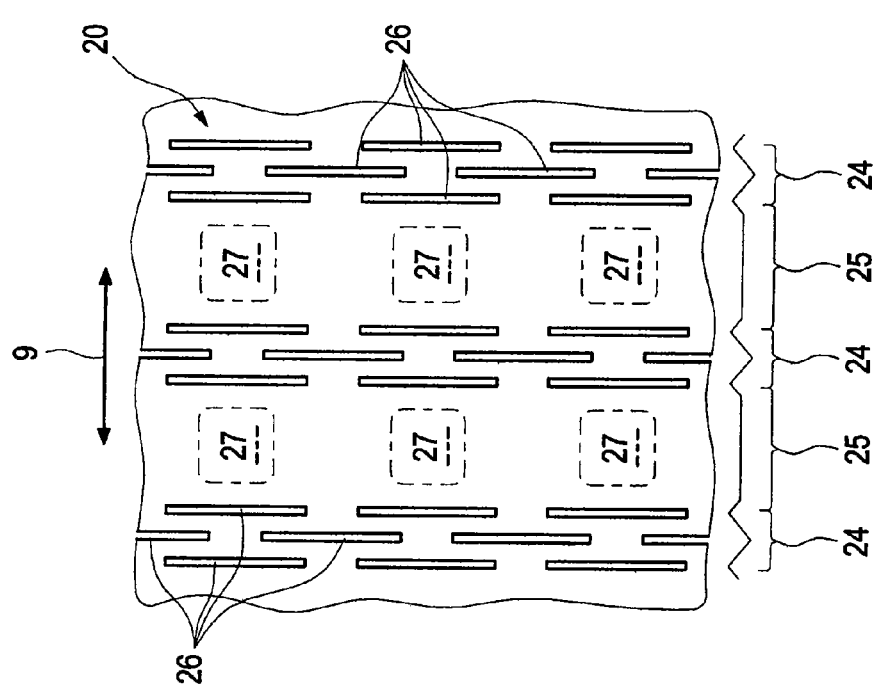
Figure 6:
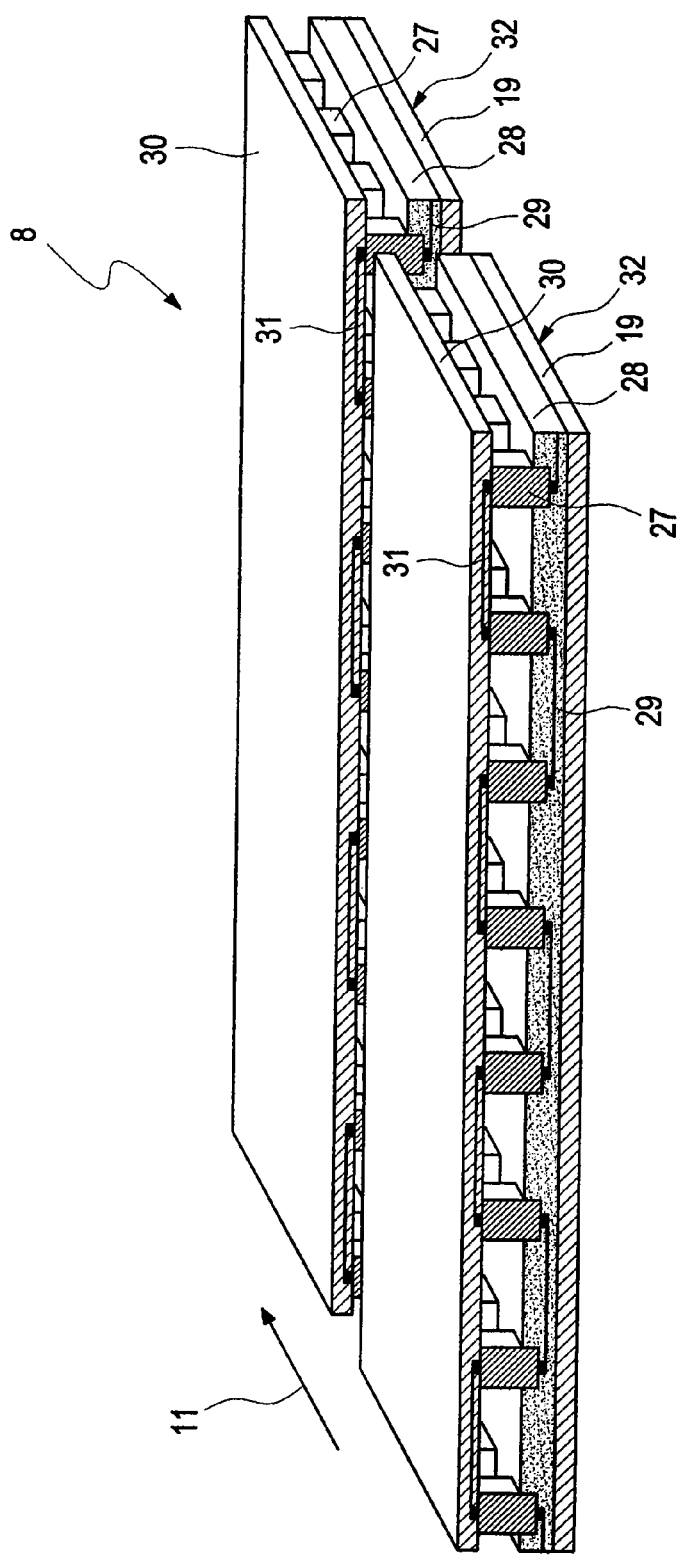

FIG. 1 a greatly simplified elementary circuit diagram representation of an exhaust system, FIG. 2 a cross section of the exhaust system in the region of a thermoelectric generator, FIG. 3 an enlarged view of a detail III from FIG. 2, however in a flat representation, FIGS. 4 and 5 each a top view of a spring structure with different embodiments, FIG. 6 an isometric representation of a thermoelectric generator with two generator modules.

According to FIG. 1, an exhaust system 1, with the help of which exhaust gases of a combustion engine 2 are discharged, comprises a plurality of exhaust-conducting components 3, each of which have an inner wall 4. The combustion engine 2 and the exhaust system 1 can be preferentially arranged in a road vehicle. Other mobile or stationary applications, such as off-road vehicles, mobile or stationary construction machines and working machines are also possible. The components 3 in the simplest case are a pipe 5 or an exhaust gas treatment device 6. Such a component 3 can likewise be formed by an exhaust manifold 7 or an exhaust manifold 7. In the example of FIG. 1, only a single exhaust gas treatment device 6 is shown. It is clear that the exhaust system 1 can comprise a plurality of exhaust gas treatment devices 6 at the same time. Different exhaust gas treatment devices 6 are possible such as for example an oxidation catalytic converter, a particle filter, an SCR-catalytic converter as well as a NOX storage catalytic converter. In addition, at least one exhaust gas treatment device 6 in form of a silencer can be provided. Basically, any combinations of such exhaust gas treatment devices 6 are conceivable.

Depending on the component 3, the inner wall 4 is formed by the component 3 itself for example if it concerns a pipe 5, or the inner wall 4 is formed by a housing section of the component 3 if it concerns for example an exhaust gas treatment device 6 or another component of the exhaust system 1, such as for example the manifold 7.

According to FIG. 1, the exhaust system 1 can also be equipped with at least one thermoelectric generator 8, which in the following is also abbreviated TE-generator 8 or generator 8. In the example of FIG. 1, two such TE-generators 8 are shown purely exemplarily. The one TE-generator 8 is attached to a component 3 configured as pipe 5, while the other TE-generator 8 is attached to a component 3 configured as exhaust gas treatment device 6. It is clear that with another embodiment only a single TE-generator 8 can also be employed. Embodiments, wherein more than two TE-generators 8 can be used are likewise conceivable.

The respective TE-generator 8 can convert heat into electric energy. To this end, the respective TE-generator 8 operates according to the inverted Peltier principle, in that it generates electric voltage from a heat flow, which electric voltage can be tapped off in order to provide the desired electric energy.

According to FIG. 2, which shows a cross section of a component 3 of the exhaust system 1 equipped with a TE-generator 8, the inner wall 4 is closed ring-like in a circumferential direction 9. The circumferential direction 9 in this case relates to a flow direction or main flow direction of the exhaust gas, which with a straight-line course of the inner wall 4 coincides with a longitudinal centre axis 10 of the component 3 or the inner wall 4. In the cross section of FIG. 2 the longitudinal centre axis 10 stands perpendicularly on the drawing plane. Accordingly, the flow direction and the main flow direction likewise run perpendicularly to the drawing plane of FIG. 2. This flow direction or main flow direction is symbolised in FIG. 1 through arrows 11.

The inner wall 4 of the component 3 comprises an inner side 12 which is exposed to the exhaust gas or the exhaust gas flow. The thermoelectric generator 8 is now arranged on an outer side 13 of the inner wall 4, i.e. separated from the exhaust gas by the inner wall 4. According to the preferred embodiment shown in FIG. 2, the TE-generator 8 is configured such that it surrounds the inner wall 4 of the component 3 ring-like in circumferential direction 9 in a closed manner. With another embodiment which is not shown, the TE-generator 8 can also surround the inner wall 4 only partially.

The terms "inner" and "outer", for example in inner wall, outer wall, inner side and outer side, refer to the relation to the longitudinal centre axis 10, wherein "inner" faces the longitudinal centre axis 10 while "outer" faces away from the longitudinal centre axis 10.

The component 3 can be additionally equipped with an outer wall 14, which surrounds the inner wall 4 in circumferential direction 9 ring-like in a closed manner. Practically, the TE-generator 8 is then arranged between the inner wall 4 and the outer wall 14. In the example of FIG. 2 the component 3 is additionally equipped with a cooling jacket 15, which surrounds the inner wall 4 of the component 3 ring-like in circumferential direction 9 in a closed manner. Accordingly, the TE-generator 8 is arranged between the inner wall 4 and the cooling jacket 15. In the example of FIG. 2 the outer wall 14 is a separate component with respect to the cooling jacket 15 and is therefore present in addition to the cooling jacket 15. Accordingly, the outer wall 14 is likewise located between the cooling jacket 15 and the inner wall 4 or between the cooling jacket 15 and the TE-generator 8. The cooling jacket 15 in the example of FIG. 2 comprises an outer wall 16 and an inner wall 17 and a coolant channel 18, in which a suitable coolant circulates, in-between. The coolant channel 18 can for example have a ring-shaped cross-sectional profile, which extends coaxially to the inner wall 4. It is likewise possible to form the cooling jacket 15 through a pipe, which with respect to the longitudinal axis 10 is wound helically about the TE-generator 8 or about the outer wall 14.

The cooling jacket 15 is provided additionally or alternatively to the outer wall 14.

With the embodiment shown in FIG. 2, the outer wall 14 of the component 3 contacts the inner wall 17 of the cooling jacket 15. Here, a flat contact is preferred in order to make possible a preferably favourable heat transport. In contrast with this, FIG. 3 shows an embodiment wherein the outer wall 14 of the component 3 is absent or coincides with the inner wall 17 of the cooling jacket 15 or is formed through the inner wall 17 of the cooling jacket 15. With this design, two heat transfers, namely the heat transfer from the TE-generator 8 to the outer wall 14 and from the outer wall 14 to the inner wall 17 are absent. Accordingly, the heat can be more effectively discharged with the embodiment shown in FIG. 3.

The TE-generator 8 directly contacts the outer side 13 of the inner wall 4 of the component 3 which makes possible intensive heat transfer from the inner wall 4 to the TE-generator 8. Therein, the TE-generator 8 according to FIGS. 3 and 6 can comprise an inner contact layer 19 with which the TE-generator 8 comes in contact directly on the outer side 13 of the inner wall 4.

In FIGS. 3 and 6 the respective region of the TE-generator 8 shown is represented flat or unrolled, although in the assembled state of FIG. 2 it is practically curved. Accordingly, the circumferential direction 9 in FIGS. 3 and 6 extends in a straight line. However, straight-line or flat sections of the TE-generator 8 are also conceivable since the inner wall 4 need not necessarily have a circular cross section, but on the one hand can have round or curved cross sections and on the other hand also angular, more preferably rectangular, cross sections.

According to FIGS. 3 and 6 the TE-generator 8 on a side facing the outer wall 14 or the cooling jacket 15 comprises a spring structure 20, which is represented in a detail in FIGS. 4 and 5 each in a top view, which with respect to the longitudinal axis 10 is orientated radially. The spring structure 20 results in that the TE-generator 8 is supported under preload on an inner side 21 of the outer wall 14 of the component 3 or on an inner side 22 of the inner wall 17 of the cooling jacket 15. There, the preload is orientated radially with respect to the axial direction 10 or the flow direction 11. Radially preloaded contacting of the TE-generator 8 on the one hand on the inner side 4 and on the other hand on the outer side 14 or on the cooling jacket 15 improve the heat transfer from the inner wall 4 via the TE-generator 8 to the outer wall 14 or to the cooling jacket 15. The better the heat conductance, the better the yield of electric energy achievable with the TE-generator 8.

The spring structure 20 however also allows a radial relative movement between the inner wall 4 and the cooling jacket 15 which mandatorily also results in a movement of the TE-generator 8 relative to the cooling jacket 15. A plurality of arrows 23 is reproduced in FIG. 2, which indicates the expansion of the inner wall 4 in the event of the inner wall 4 being heated up during a cold start of the combustion engine 2. During such a cold start the inner wall 4 heats up in time before the outer wall 14 or relative to the cooling jacket 15 that is cooled anyhow. In this regard, such expansion occurs, which results in a relative adjustment of the TE-generator 8 relative to the outer wall 14 or relative to the cooling jacket 15. The spring structure 20 allows such a relative adjustment and in the process simultaneously brings about an increasing preload of the TE-generator 8 on the one hand against the inner wall 4 and on the other hand against the outer wall 14 or against the cooling jacket 15. As a result, the efficiency of the TE-generator 8 is increased during the operation of the combustion engine 2.

According to FIGS. 4 and 5 the spring structure 20 is spring-elastically configured yielding in circumferential direction 9 so that the spring structure 20 can easily offset the expansion or the adjustment of the TE-generator 8 to the outside. To realise the desired spring elasticity within the spring structure, the spring structure 20 can comprise regions 24 and 25 which possess different elasticities in circumferential direction 9. There, regions 24 of higher elasticity and regions 25 of lower elasticity alternate in circumferential direction 9. In the examples of FIGS. 4 and 5, the regions of higher elasticity 24 are each realised with the help of breakthroughs 26, which can be realised in the form of slits (FIG. 4) or with complex geometries (FIG. 5), in order to guarantee the desired spring elasticity. It is likewise possible, instead of breakthroughs 26, to reduce the thickness of the spring material in order to increase the spring elasticity in this manner. Three-dimensional shaping can also be carried out specifically so that the spring structure 20 in the regions 24 has higher spring elasticity in circumferential direction 9 than in the regions 25. For example, the regions 24 can be configured wave-shaped or folded zigzag, wherein the individual waves or folds extend parallel to the longitudinal axis 10 and are adjacent in circumferential direction 10. It is likewise possible to stiffen the regions 25 with lower elasticity through beads or the like. The spring structure 20 can more preferably be designed as a shaped sheet metal part.

According to FIGS. 3 and 6, the TE-generator 8 practically comprises a multiplicity of individual thermoelectric elements 27, which in the following can also be designated TE-elements 27 or elements 27. The individual TE-elements 27 can each convert heat into electric energy. For forming the TE-generator 8, the TE-elements 27 are electrically interconnected and according to FIG. 3 spaced from one another at least in circumferential direction 9. According to FIG. 6, the TE-elements 27 can also be spaced from one another in axial direction 10. It is clear that rows of TE-elements 27, having TE-elements 27 adjacent in circumferential direction 9, are then adjacent to one another in axial direction 10.

Practical now is an embodiment wherein the spring structure 20 is matched with respect to its regions 24, 25 to the positioning of the TE-elements 27 within the TE-generator 8, specifically so that the TE-elements 27 are positioned on the spring structure 20 in each case in the regions 25 having the lower elasticity. Because of this, the radial preload is specifically introduced in the positions of the TE-elements 27.

As can be seen from FIGS. 3 and 6 the TE-generator 8 can comprise at least one substrate matrix 28 on which the associated TE-elements27 are arranged fixed in position relative to one another. The individual TE-elements 27 are shown partially embedded in the substrate matrix 28. Here, an embodiment wherein the substrate matrix 28 contains electric contacts 29 which electrically interconnect the TE-elements 27 in a suitable manner is particularly advantageous. The contacts 29 to this end can be embedded in the substrate matrix 28, i.e. run within the substrate matrix 28.

In addition, the TE-generator 8 can be equipped with an outer contact layer 30 via which the TE-generator 8 supports itself on the spring structure 20. In the example, the outer contact layer 30 is also equipped with electrical contacts 31 which electrically interconnect the TE-elements 27 in a suitable manner. These contacts 31, too, can be practically embedded in the outer contact layer 30, so that these run within the outer contact layer 30. In the shown examples, the individual TE-elements 27 are connected in series so that adjacent TE-elements 27 are alternately interconnected electrically through the contacts 29 of the substrate matrix 28 and through the contacts 31 of the outer contact layer 30.

The inner contact layer 19 and/or the outer contact layer 30 serve/s for the improvement or for the achievement of a flat contact with the inner wall 4 or with the outer wall 14 or with the cooling jacket 15. There, the respective contact layer 19 or 30 can more preferably realise a tolerance offset. Graphite foil for example is suitable as contact layer 19, 30.

The inner contact layer 19 and/or the outer contact layer 30 can comprise a multi-layer or multiply construction independent of the embodiments shown here. For example, pressure-proof insulation foils for example of polyimide, aramid, Kapton or generally from thermosetting plastics or from temperature-resistant plastics can be provided for embedding and insulating the conductors 29, 31 and for insulation against the inner wall 4 or against the outer wall 14 or the cooling jacket 15.

According to FIGS. 2 and 6, the TE-generator 8 can be modularly constructed according to a preferred embodiment. Accordingly, the respective TE-generator 8 comprises a plurality of generator modules 32. These generator modules 32 are electrically interconnected in a suitable manner in order to form the TE-generator 8 in the assembled state. According to FIG. 2, a plurality of generator modules 32 can be arranged adjacently in circumferential direction 9. FIG. 2 exemplarily shows four identical generator modules 32 each of which covers an arc segment of 90°. It is clear that other divisions can also be realised. In contrast with this, FIG. 6 shows two generator modules 32 which in the main flow direction 11, which prevails within the respective component 3 at least within the inner wall 4, are arranged one after the other.

Evidently each generator module 32 comprises a plurality of TE-elements 27, the substrate matrix 28 and optionally the contact layers 19, 30. Practically, identical generator modules 32 are provided which can be adapted to the respective form of application, i.e. to the respective component 3.

The inner wall 17 of the cooling jacket 15 according to FIG. 3 can have a spring-elastic structure in axial direction and/or in circumferential direction, which can more preferably be designed wave-shaped.

With the special embodiment shown in FIG. 3 it is additionally evident that the inner wall 4 on its inner side 12 can be equipped with a heat exchanger structure 33. Such a heat exchanger structure 33, which for example can comprise a multiplicity of ribs or fins or the Ikke, improves the heat transfer of the exhaust gas to the inner wall 4. In addition, or alternatively, the inner wall 17 of the cooling jacket 15 can likewise comprise a heat exchanger structure 34 which for example can be realised through ribs or beads or a wave shape. This heat exchanger structure 34 improves the heat transfer, specifically from the inner wall 17 to the coolant transported in the coolant channel 18. It is clear that additionally or alternatively the outer side 16 of the cooling jacket 15 can also be equipped with such a heat exchanger structure 34. It is clear, furthermore, that the heat exchanger structure 33 of the inner wall 4 and/or the heat exchanger structure 34 of the cooling jacket 15 can be realised independently of each other and can also be realised independently of the other features of the TE-generator 8 shown in FIG. 3 or the specific exemplary embodiment of FIG. 3.

According to FIG. 1, the cooling jacket 15 can be connected to a cooling circuit 35 or 36. In the example, to simplify explanation, two cooling circuits 35, 36 are shown, namely a high-temperature cooling circuit 35 which for example can be the cooling circuit of the combustion engine 2, and a low-temperature cooling circuit 36, which compared with the high-temperature cooling circuit 35, is characterized by a clearly lower temperature in the coolant. For example, a coolant temperature of approximately 20° can be realised in the low-temperature cooling circuit 36. In contrast with this, the high-temperature coolant circuit 35 usually has a coolant temperature of approximately 90°. A particularly high efficiency of the TE-generator 8 can be realised in conjunction with a particularly high temperature drop. A particularly high temperature drop can be realised with the help of the low-temperature cooling circuit 36. The respective cooling circuit 35, 36 contains a coolant pump 37 and a suitable heat exchanger 38 to which ambient air can be admitted for example. The positioning of the individual components of the respective cooling circuit 35, 36 shown in FIG. 1 is purely exemplary. More preferably, the shown position of the cooling jacket 15 in the high-temperature cooling circuit 35 upstream of the combustion engine 2 is suboptimal.

For producing the component 3 it can be provided to initially create an arrangement with which the thermoelectric generator 8 is arranged radially between the inner wall 4 and the outer wall 14. This can be realised for example in that initially the thermoelectric generator 8 is attached outside on the inner wall 4. After this, the outer wall 14 can be axially pushed on to the unit of inner wall 4 and generator 8. It is likewise possible to initially insert the thermoelectric generator 8 in the outer wall 14 in order to subsequently axially insert the inner wall 4 in the unit of generator 8 and outer wall 14.

Following this, the outer wall 14 is plastically re-formed in such a manner that its cross section is reduced. Re-forming therefore is effected in radial direction. The objective of this re-forming process is to generate elastic compression of the thermoelectric generator 8 or the spring structure 20 of the generator 8. As a result of this, through the re-forming of the outer wall 14, the desired radial preload of the generator 8 relative to the inner wall 4 and relative to the outer wall 14 can be established. This subsequent generation of the inner radial preload is advantageous since as a result the insertion of the generator 8 in the annular space radially between the inner wall 4 and the outer wall 14 is substantially simplified during assembly.

The invention claimed is:

1. An exhaust system for a combustion engine, adapted for use in a road vehicle or another mobile or stationary device, said exhaust system comprising:
   at least one exhaust gas-conducting component having an inner wall closed ring-like in a circumferential direction, whose inner side is exposed to the exhaust gas,
   a cooling jacket having a first outer wall ring-like concentrically surrounding said inner wall in the circumferential direction in a closed, spaced manner,
   at least one thermoelectric generator which converts heat into electric energy and which is disposed between said inner wall and said cooling jacket, and
   a spring structure under circumferential preload for applying a radial preload to and for supporting said at least one thermoelectric generator on an outer side of said inner wall or on an inner side of said first outer wall, wherein said spring structure includes regions with different elasticity in the circumferential direction, wherein regions of higher elasticity and regions of lower elasticity alternate in the circumferential direction.

2. The exhaust system according to claim 1, wherein the thermoelectric generator surrounds the inner wall in the circumferential direction in a closed manner.

3. The exhaust system according to claim 1, wherein said cooling jacket further includes a second outer wall concentrically disposed about said first outer wall in a closed manner.

4. The exhaust system according to claim 1, wherein the first outer wall of said cooling jacket contacts said at least one thermoelectric generator.

5. The exhaust system according to claim 1, wherein the at least one thermoelectric generator contacts an outer side of the inner wall.

6. The exhaust system according to claim 5, wherein the spring structure in the circumferential direction is configured yielding spring-elastically.

7. The exhaust system according to claim 1, wherein the at least one thermoelectric generator comprises a multiplicity of individual thermoelectric elements which convert heat into electric energy and which are electrically interconnected and spaced from one another in the circumferential direction.

8. The exhaust system according to claim 1 wherein the thermoelectric elements are positioned on the spring structure in a region of lower elasticity.

9. The exhaust system according to claim 6, wherein the at least one thermoelectric generator comprises at least one substrate matrix on which a plurality of thermoelectric elements fixed in position relative to one another are arranged.

10. The exhaust system according to claim 9, wherein the thermoelectric elements are electrically interconnected through contacts running within the substrate matrix.

11. The exhaust system according to claim 1, wherein the at least one thermoelectric generator comprises an outer contact layer with which it is supported on the spring structure.

12. The exhaust system according to claim 1, wherein the thermoelectric generator has an inner contact layer with which it contacts the outer side of the inner wall.

13. The exhaust system according to claim 11, wherein said at least one thermoelectric generator includes plural thermoelectric elements, and wherein said thermoelectric elements are electrically interconnected through electrical contacts running within the outer contact layer.

14. The exhaust system according to claim 1, wherein the at least one thermoelectric generator is of a modular construction, and wherein a plurality of generator modules are arranged adjacent one another in the circumferential direction and in a main flow direction of the exhaust gas.

15. The exhaust system according to claim 14, wherein each generator module comprises a plurality of thermoelectric elements.

16. The exhaust system according to claim 14, wherein each generator module comprises at least one of a substrate matrix and an outer contact layer and an inner contact layer.

17. A thermoelectric generator for installation in an exhaust system according to claim 1.

18. A method for producing an exhaust system according to claim 1, wherein the thermoelectric generator arranged between the inner wall and the outer wall is radially preloaded in that the outer wall for reducing its cross section is plastically re-formed.

* * * * *